(12) United States Patent
Williams

(10) Patent No.: US 7,403,066 B2
(45) Date of Patent: Jul. 22, 2008

(54) METHOD AND SYSTEM FOR CREATING A SPECTRAL NULL IN A SWITCHING AMPLIFIER

(75) Inventor: Curtis M. Williams, Schaumburg, IL (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 11/271,395

(22) Filed: Nov. 10, 2005

(65) Prior Publication Data

US 2007/0103230 A1 May 10, 2007

(51) Int. Cl.
*H03F 3/38* (2006.01)
(52) U.S. Cl. .................... 330/10; 300/207 A; 300/251
(58) Field of Classification Search ............. 330/10, 330/207 A, 251
See application file for complete search history.

(56) References Cited

U.S. PATENT DOCUMENTS

| | | | |
|---|---|---|---|
| 5,617,058 A * | 4/1997 | Adrian et al. | ............ 330/10 |
| 6,587,010 B2 | 7/2003 | Wagh et al. | |
| 6,605,991 B2 | 8/2003 | Midya et al. | |

* cited by examiner

*Primary Examiner*—Robert Pascal
*Assistant Examiner*—Hieu P Nguyen

(57) ABSTRACT

A method and system for creating a spectral null in a switching amplifier system is provided. The method includes receiving an input signal in a first modulated form at an input stage 104 of the amplifier. The method further includes converting the input signal to a second modulated form. The input signal in the second modulated form is referred to as a first switching signal. Further, the method includes determining switching frequency of the first switching signal from a predefined cycle time of the first switching signal. Thereafter, the method includes inverting the first switching signal and delaying it by a predefined delay amount. The inverted and delayed first switching signal is referred to as a second switching signal. The method further includes summing the first switching signal from the second switching signal, which results in a two-state output signal. The two-state output signal is free of any components at the switching frequency and its odd harmonics.

14 Claims, 8 Drawing Sheets

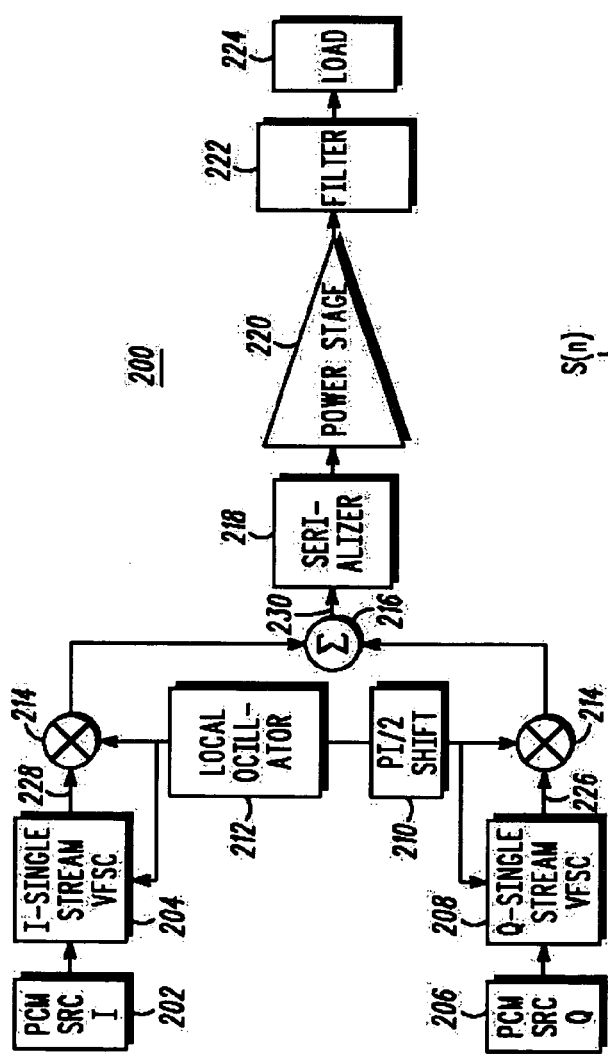
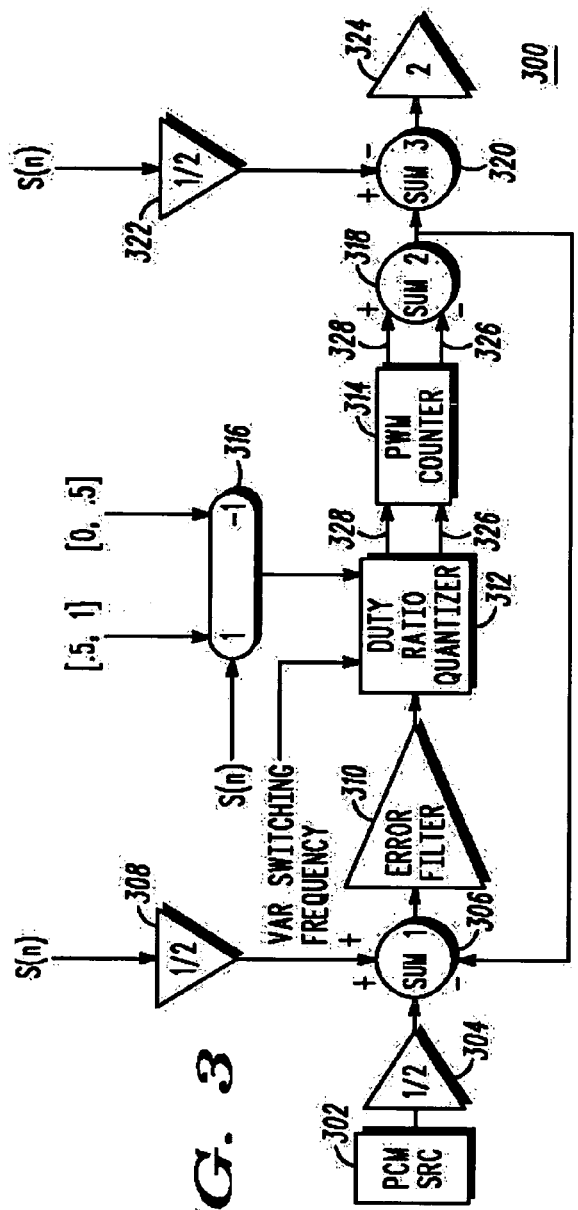
FIG. 2
FIG. 3

METHOD AND SYSTEM FOR CREATING A SPECTRAL NULL IN A SWITCHING AMPLIFIER

FIELD OF THE INVENTION

The present invention relates generally to the field of integrated circuits, and more specifically, to switching amplifiers to process input signals.

BACKGROUND

Switching amplifiers are widely used for processing input signals. Switching amplifiers receive a modulated signal, such as a pulse-width modulated digital signal. Most high efficiency switching amplifiers are based on the principle of Pulse Width Modulation (PWM), which is widely used in a variety of applications, which include digital audio amplifiers and control applications including motor controllers. Many of these applications convert a sampled digital signal to a digital PWM signal to achieve high efficiency and accuracy. The digital PWM signal is input to a switching amplifier that increases signal swing, to translate the digital PWM input signal to a PWM signal with significantly higher voltage levels. Undesirable spur components introduced in the switching amplifiers are associated with the frequency at which the PWM signal is switched. Undesired component exists at the switching frequency and the harmonics of the switching frequency. The components at the switching frequency and the harmonics of the switching frequency are typically in passband of the amplifier, allowing amplification of undesired off-channel signal components. Power devoted to generation of such off channel components reduces the efficiency of the amplifier. Hence, the switching frequency components in an input signal need to be eliminated.

There are several known methods for removing the signal component at the switching frequency and the odd harmonics thereof. One such method uses a four-pole filter to suppress the switching frequency. However, four-pole filters are generally bulky and require a lot of space, and are therefore not suitable for integration. Another method for removing switching frequency and the harmonics thereof suppresses the switching frequency by superimposing two components of an input signal. A first component is the original input signal and the other component is an inverted and delayed signal of the first component. The system uses two frequency components of the signal, which are overlapping, and which cancel each other thereby producing a three-stage signal. This signal after it is decoded, results in a signal, which is free from the switching frequency and the odd harmonics thereof. However, there are several computational overheads in such designs and the overall system becomes complex.

BRIEF DESCRIPTION OF THE FIGURES

The accompanying figures where like reference numerals refer to identical or functionally similar elements throughout the separate views and which together with the detailed description below are incorporated in and form part of the specification, serve to further illustrate various embodiments and to explain various principles and advantages all in accordance with the present invention.

FIG. 2 representatively illustrates a schematic circuit diagram of a circuitry for creating a spectral null in an amplifier system in accordance with an embodiment of the present invention.

FIG. 3 representatively illustrates a block diagram of a single-stream variable-frequency suppressed carrier block, in accordance with an embodiment of the present invention

DETAILED DESCRIPTION

Figure 1:
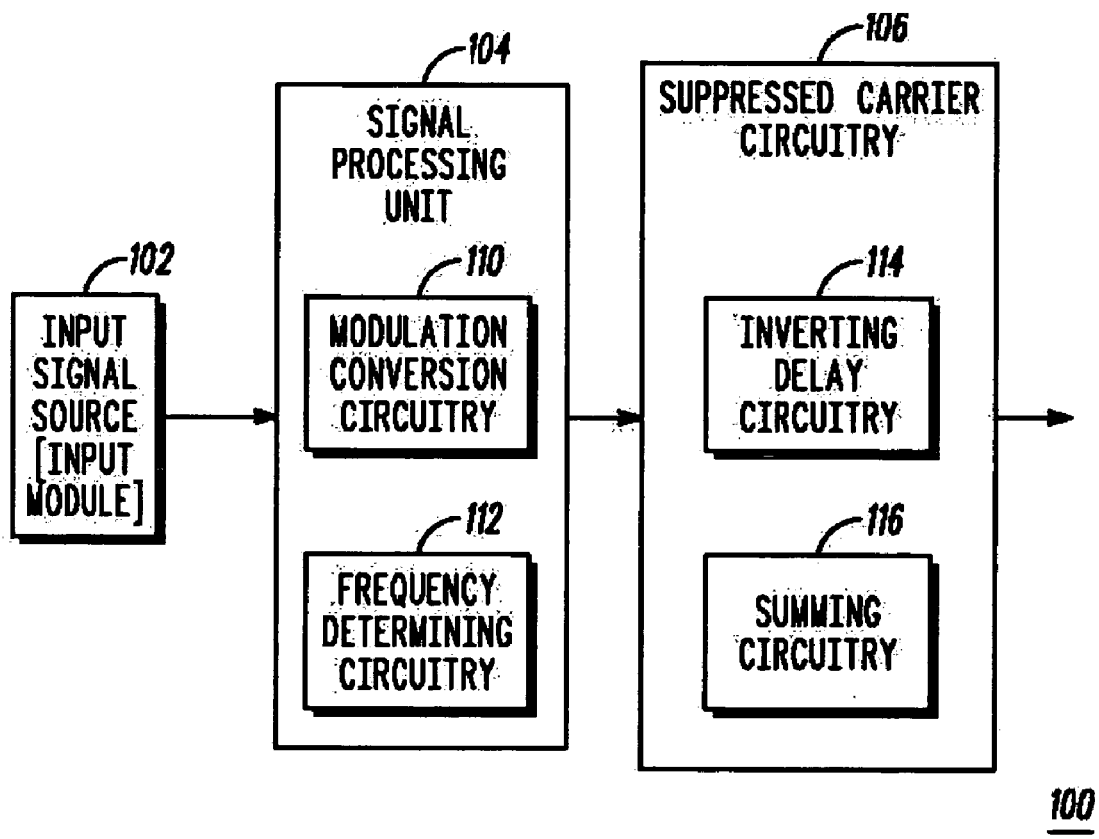
FIG. 1 representatively shows a block diagram of an amplifier system in accordance with some embodiments of the present invention.

Before describing in detail the particular method and system for creating a spectral null in a switching amplifier in accordance with the present invention, it should be observed that the present invention resides primarily in combinations of method steps and apparatus components related to method and system for creating a spectral null in a switching amplifier. Accordingly, the apparatus components and method steps have been represented where appropriate by conventional symbols in the drawings, showing only those specific details that are pertinent to understanding the present invention so as not to obscure the disclosure with details that will be readily apparent to those of ordinary skill in the art having the benefit of the description herein.

A method and system for creating a spectral null in switching amplifier systems is provided, in accordance with the present invention. A switching amplifier system receives an input signal in a first modulated form. The input signal is converted to a second modulated form and is referred to as a first switching signal. A switching frequency is determined from a predefined cycle time of the first switching signal. Thereafter, a second switching signal is generated from the first switching signal. The second switching signal is inverted and delayed by a delay amount as compared to the first switching signal. Thereafter, the first switching signal is summed with the second switching signal to provide a two-state output signal in order to create a spectral null in the switching amplifier system.

FIG. 1 representatively shows a block diagram of an amplifier system 100 in accordance with some embodiments of the present invention. The amplifier system 100 includes an input signal source 102, a signal-processing unit 104 and a suppressed carrier circuitry 106. The output signal 108 is the output of the amplifier system 100.

The input signal source 102 may be any type of source used to provide an input signal. For example, the input signal source 102 may be a compact disc (CD) player source, an audio signal, television signal, a data stream, or any other type of audio, video or data input signal. These input signals may be digital signals and converting them to radio frequency (RF) signals is desired for processing them. The input signal source 102 may be either digital or analog. The input signal source 102 generates an input signal that is provided as an input to the signal-processing unit 104, which receives the input signal from the input signal source 102. Further, in an embodiment of the present invention the input signal may be received at an input module of the amplifier system 100 and then sent to the signal-processing unit 104 for processing of the input signal. The output of the signal-processing unit 104 is connected to the suppressed carrier circuitry 106. The output of the suppressed carrier circuitry 106 is the output signal 108 of the amplifier system 100.

The input signal is received at the signal-processing unit 104 from the input signal source 102 in a first modulated form. Examples of the first modulated form signal include a pulse code modulation (PCM) signal, a pulse width modulation (PWM) signal and a pulse density modulation (PDM) signal. The signal-processing unit 104 modulates the input signal to a digital PWM signal. In an embodiment of the present invention, the modulation conversion is performed by a modulation conversion circuitry 110 of the signal processing unit 104. In addition the signal-processing unit 104 may modify the sampling rate of the input signal. In an embodiment of the present invention, the sampling rate of the input signal may be low, so the input signal is up-sampled to bring it to a desired sampling frequency. For applications where the input sampling rate is high, the signal is set to the desired sampling frequency. Sampling rate of an input signal has to be increased so as to minimize aliasing in the signals. Aliasing creates a significant distortion in the input signals. In an embodiment of the present invention, the sampling rate modification may be done by a frequency determining circuitry 112 of the signal processing unit 104. In an embodiment of the present invention, the frequency determining circuitry 112 is also responsible for dithering frequency components which cause spurs or undesired spectral components in the input signal. The suppressed carrier circuitry 106 creates a spectral null in the input signal after it has been processed by the signal processing unit 104 by eliminating odd harmonics of the switching frequency. This process of eliminating the odd harmonics of the switching frequency is achieved by summing a first switching signal and a second switching signal, the second switching signal being inverted and delayed from the first switching signal by a certain delay amount. In an embodiment of the invention, the first switching signal may be summed with the second switching signal using a summation circuitry 116. Further, the suppressed carrier circuitry 106 increases the fundamental frequency of the input signal to twice its value. The fundamental frequency of the input signal has only even components of the switching frequency. The suppressed carrier circuitry 106 is further explained in conjunction with FIG. 3.

The digital PWM signal may be a single-sided PWM signal or a double-sided PWM signal. The desired sampling frequency for single-sided PWM signals is equal to the switching frequency of the input signal. In case of double-sided PWM signals, the desired sampling frequency is twice the switching frequency. A double-sided PWM signal is characterized by both the rising edges and the falling edges of a PWM signal being modulated.

FIG. 2 representatively illustrates a schematic circuit diagram of a circuitry for creating a spectral null in an amplifier system in accordance with an embodiment of the present invention. The circuitry includes a pulse-code modulated (PCM) in-phase block 202 for receiving the in-phase component of the input PCM signal, and an in-phase single-stream variable-frequency suppressed carrier block 204 for processing the in-phase input PCM signal. The circuitry further includes a PCM quadrature-phase block 206 for receiving quadrature component of the input PCM signal, and a quadrature-phase single-stream variable-frequency suppressed carrier block 208 for processing quadrature-phase component of the input PCM signal. FIG. 2 further shows a phase shifter 210 that introduces a phase difference between the carrier waves for in-phase and quadrature phase components of the signal, a local oscillator 212 for producing carrier wave, multiplier blocks 214, a summation block 216, a serializer 218, a power stage 220, a filter 222 and a load 224.

The circuitry receives an in-phase component of the PCM input signal at the in-phase block 202. The circuitry also receives a quadrature component of the PCM input signal at the PCM quadrature-phase block 206. The output of the PCM in-phase block 202 acts as the input to the in-phase single-stream variable-frequency suppressed carrier block 204. The in-phase single-stream variable-frequency suppressed carrier block 204 is explained in detail in FIG. 3. The output of the PCM quadrature-phase block 206 acts as the input to the quadrature-phase single-stream variable-frequency suppressed carrier block 208.

The output of the in-phase single-stream variable-frequency suppressed carrier block 204 is the in-phase component of the two-state output signal 228. In an embodiment of the present invention, the in-phase component of the two-state output signal 228 is a PWM signal. Similarly, the output of the quadrature-phase single-stream variable-frequency suppressed carrier block 208 is quadrature-phase component of the two-state output signal 226. The quadrature-phase component of the two-state output signal 226 is a PWM signal. The in-phase component of the two-state output signal 228 is sent to the multiplier 214 and is multiplied by the output of the local oscillator 212. Similarly, the quadrature-phase component of the two-state output signal 226 is multiplied by the phase-shifted wave from the phase shifter 210 by using the multiplier 214. The in-phase component of the single-stream variable-frequency suppressed carrier and quadrature phase of single-stream variable-frequency suppressed carrier are upmixed in this block, to generate the RF frequency, using the phase shifter 210, the local oscillator 212, the multiplier blocks 214, and the summation block 216. The local oscillator 212 generates the frequency required to place the information signal at the desired center frequency.

The output of the multipliers 214 is summed at the summation block 216. The output of the summation block 216 is a radio frequency PWM signal 230 that is given as an input to the serializer 218 to serialize the radio frequency PWM signal 230 and convert incoming parallel streams into a serial output. The output of the serializer 218 is provided as an input to the power stage amplifier 220 which has only a NORMAL or an INVERTED state at its output. The power stage amplifier 220 uses only NORMAL and INVERTED stages to create the power used to drive the load. The input to the power stage amplifier 220 has no components at the odd harmonics of the switching frequency and has reduced (binary in this embodiment) amplitude levels. This will ease the power stage 220 and filter 222 complexity and design requirements. The output of the power stage amplifier 220 is provided as an input to the filter 222 to remove the remaining undesired components of the radio frequency PWM signal 230 to an acceptable level. The output of the filter acts as an input to the load 224 of the amplifier system. Examples of the load 224 include speakers and antennas. The output at the load 224 of the amplifier system is presented with a signal which contains desired components and undesired products which have been reduced to an acceptable level.

The circuitry provided by VFSC 204 and 208, as described in FIG. 2, thus eliminates the odd harmonics of the input signal. Further, the circuitry gives an RF output signal, when the input signal to the in-phase single-stream variable-frequency suppressed carrier block 204 is either an audio signal, a baseband signal, an IF signal or the like.

FIG. 3 representatively illustrates a block diagram of a single-stream variable-frequency suppressed carrier block 300, in accordance with an embodiment of the present invention. The single-stream variable-frequency suppressed carrier block 300 is used for introducing a spectral null in an input signal by eliminating odd harmonics components of the switching frequency of the input signal. The block diagram further illustrates a PCM sample rate conversion (SRC) block 302, a first multiplier block 304, a first summation block 306 and a level offset block 308. FIG. 3 further shows an error filter 310, a duty ratio quantizer 310, a PWM counter block 314, a duty ratio limiter 316, a second summation block 318, a third summation block 320, a third multiplier 322 and a fourth multiplier 324.

The PCM SRC block 302 receives the in-phase component of the input signal and scales the input signal by a predefined constant in the first multiplier block 304. In an embodiment of the invention the predefined constant is ½. The input signal is received at the level offset 308 and is input to the first summation block 306 after scaling by the same predefined constant. The first summation block 306 adds the signal from the first multiplier block 304 and the signal from the level offset 308. The output of the first summation block 306 is input to the error filter 310. The error filter 310 filters the output of the first summation block 306. The error filter 310 may be an INS error filter which performs noise shaping as part of the feedback loop. In some embodiments of the invention, other filters, such as sigma-delta type structures may be used as error filter 310. Errors in the output signal of the first summation block 306 may be quantization error that are introduced by the loop and which decreases the resolution of the signal since amplitude of the signal is being limited to binary or N levels.

Figure 7:
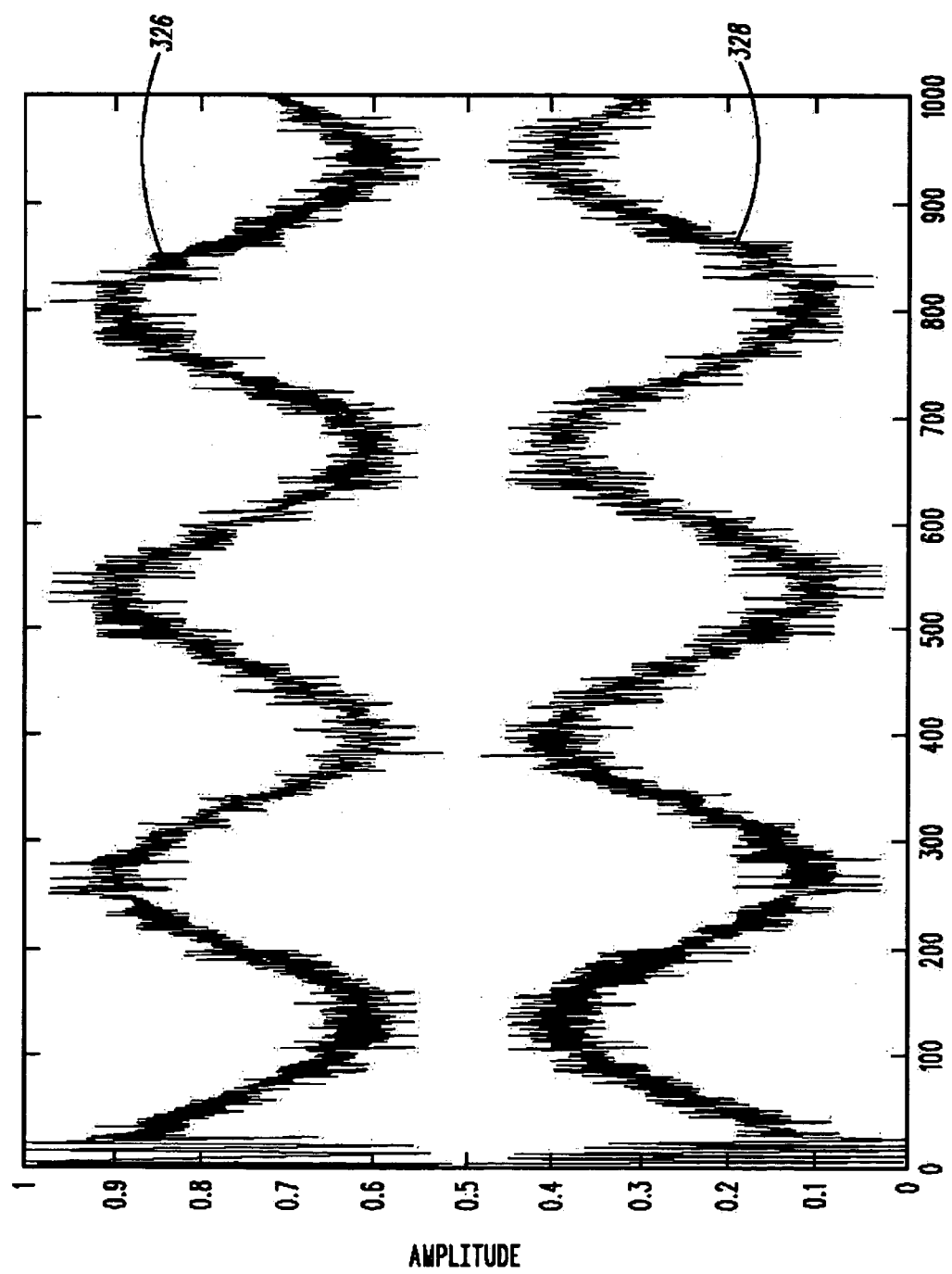
FIG. 7 illustratively represents duty cycle representations for a single-stream case for an in phase channel of a modulator in accordance with some embodiments of the present invention.

The output of the error filter 310 is provided as an input to the duty ratio quantizer 312. In an embodiment of the present invention, the duty ratio quantizer 312 quantizes and divides the output of the error filter into two signals using variable switching frequency signal as input. The first part of the signal is referred to as a first switching signal 326 and the second part of the signal is referred to as a second switching signal 328. The first switching signal 326 and the second switching signal 328 are formed such that their duty ratios do not overlap preventing creation of a third state. This is achieved using a duty ratio limiter 316. The duty ratio limiter 316 may be a multiplexer, which selects the duty cycle ratio limit between either (0 and 1) or (0 and −1). In an embodiment of the present invention, the first switching signal 326 is a PWM signal. Pulse width of the second switching signal is the same as that of a corresponding pulse of the first switching signal. The second switching signal 328 is inverted and delayed by a delay amount as compared to the first switching signal 326. In case of PWM the signal has a constant switching rate and the signal information is contained by selecting a duty ratio of this PWM signal. Hence, for each switching rate period a duty ratio may be selected. Some of the selected duty ratios are shown in FIG. 7. If duty ratio of the first switching signal 326 is selected as D, the duty cycle of the second switching signal 328 is selected as 1-D. It can be seen in FIG. 7, that adding the first switching signal 326 and the second switching signal 328 always results in a '1'. Further, since the second switching signal 328 is inverted as compared to the first switching signal 326, the first switching signal 326 and the second switching signal 328 are mirror images of each other in each period.

In some embodiments of the present invention the second switching signal 328 is generated by an inverting delay circuitry 114 coupled to the modulation conversion circuitry. The first switching signal 326 and the second switching signal 328 are of a signal type, selected from a group consisting of a PWM signal and a PDM signal.

The PWM counter 314 estimates the switching frequency and reduces the ripples of the first switching signal 326 and the second switching signal 328. The PWM counter 314 is a circuit block that counts serial clock cycles of the signal to convert a duty cycle number that is generated every switching frequency cycle into an actual serial stream that will contain the correct duty ratios of 1's and 0's. The PWM counter 314 is a circuit block which increments its count at each cycle until it equals the PCM signal value. The PWM counter 314 further sends the first switching signal 326 and the second switching signal 328 to the second summation block 318. The second summation block 318 subtracts the first switching signal 326 from the second switching signal 328, which results in a two-state or a binary output signal and which does not retain a switching frequency and the odd harmonics of the input signal.

In an embodiment of the present invention, the first switching signal 326 may be summed with the second switching signal 328 using a summation circuitry 116. The summation circuitry 116 may be a part of the suppressed carrier circuitry 106. The resulting output signal has only even components of the input signal such that the fundamental frequency seems to be twice the original switching fundamental frequency. After the summing the first switching signal 326 and the second switching signal 328 in the second summation block 318, the offset is removed and the dynamic range is recovered by rescaling the output signal of the inverse of the predefined constant. Further, by rescaling and offsetting the output signal at the third summation block 320 outputs a serial-stream of binary 1s & 0s such that amplitude and shift operations can be performed on the signal. In some embodiments of the present invention a similar circuitry is employed for processing the quadrature-phase component of the PCM input signal, and a similar output signal is produced for the quadrature-phase component of the PCM input signal.

Figure 4:
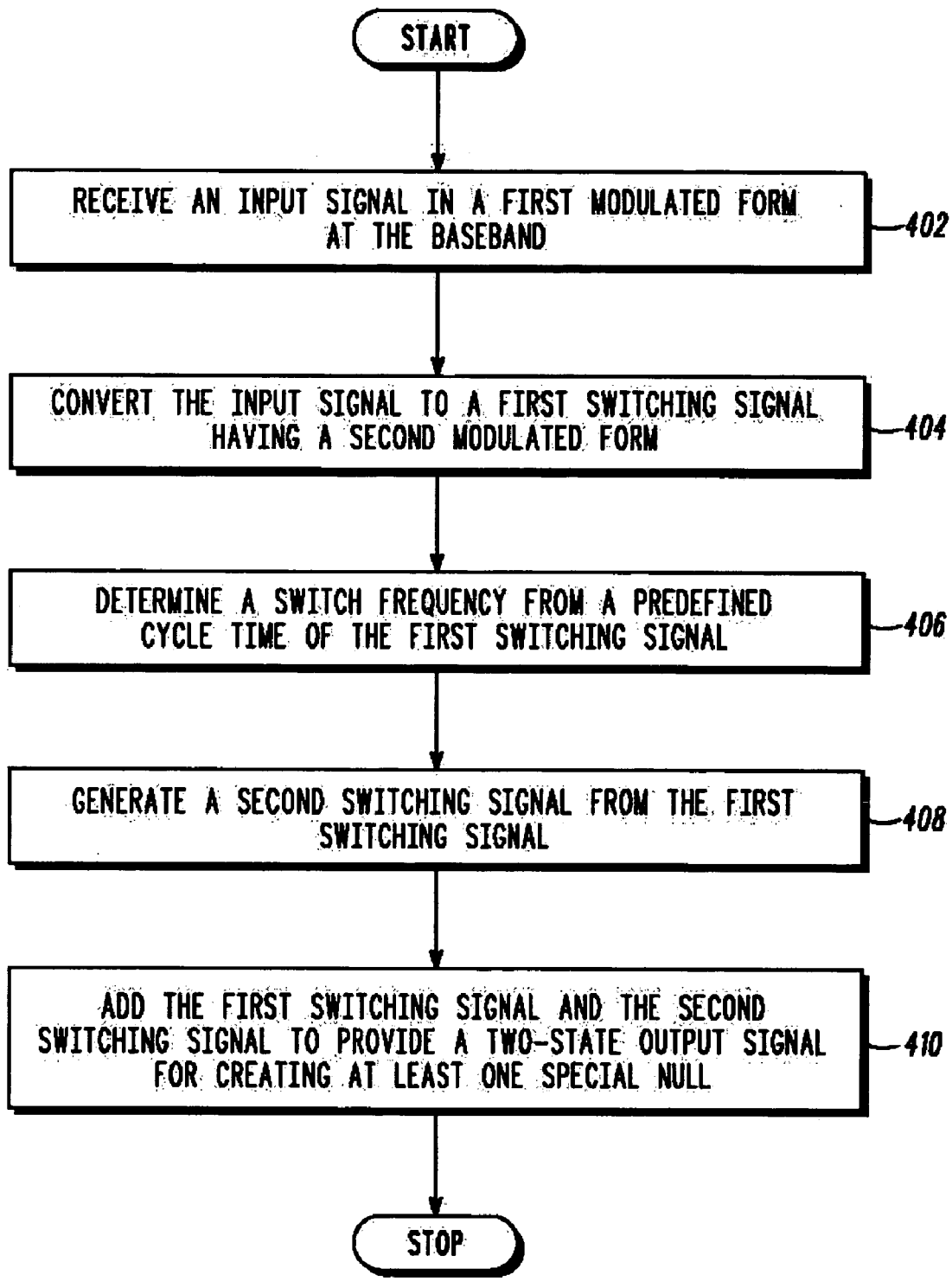
FIG. 4 represents a flowchart depicting a method for creating a spectral null in switching amplifiers in accordance with some embodiments of the present invention.

FIG. 4 represents a flowchart depicting a method for creating a spectral null in switching amplifiers in accordance with some embodiments of the present invention according to the circuits in FIGS. 2 and 3. At step 402, the amplifier system receives an input signal in a first modulated form at the baseband of the amplifier system. The input signal in the first modulated form may be a PCM signal. In an embodiment of the invention, step 402 may take place at PCM SRC block 302. After receiving the input in the first modulated form, the input signal is converted to a second modulated form, which can be referred to as a first switching signal, at step 404. Step 404 is performed at the modulation conversion circuitry 110 of the signal processing unit 104. At step 406, the switch frequency of the first switching signal is determined from a predefined cycle time of the first switching signal. After the switch frequency of the first switching signal is determined, a second switching signal is generated from a first switching signal, at step 408. The second switching signal is generated from the first switching signal at the duty ratio quantizer 312. The switching frequency of the first switching signal helps in extracting the duty cycle information of the first switching signal. The second switching signal is inverted and delayed by a predefined delay '1-D' as explained in conjunction with FIG. 3, as compared to the first switching signal. The delay amount introduced in the second switching signal is such that the first switching signal and the second switching signal do not overlap, as shown and explained in conjunction with FIG. 7.

At step 410, the first switching signal is added to the second switching signal resulting in a two-state signal output. The first switching signal and the second switching signal are added by the summation block 320. The two-state signal output does not have a component at the switch frequency or its odd harmonics as the first switching signal and the second switching signal are of same frequency but are delayed by a predefined delay amount. The output signal is a two-state signal because of the non-overlapping duty cycles of the first switching signal and the second switching signal.

Figure 5:
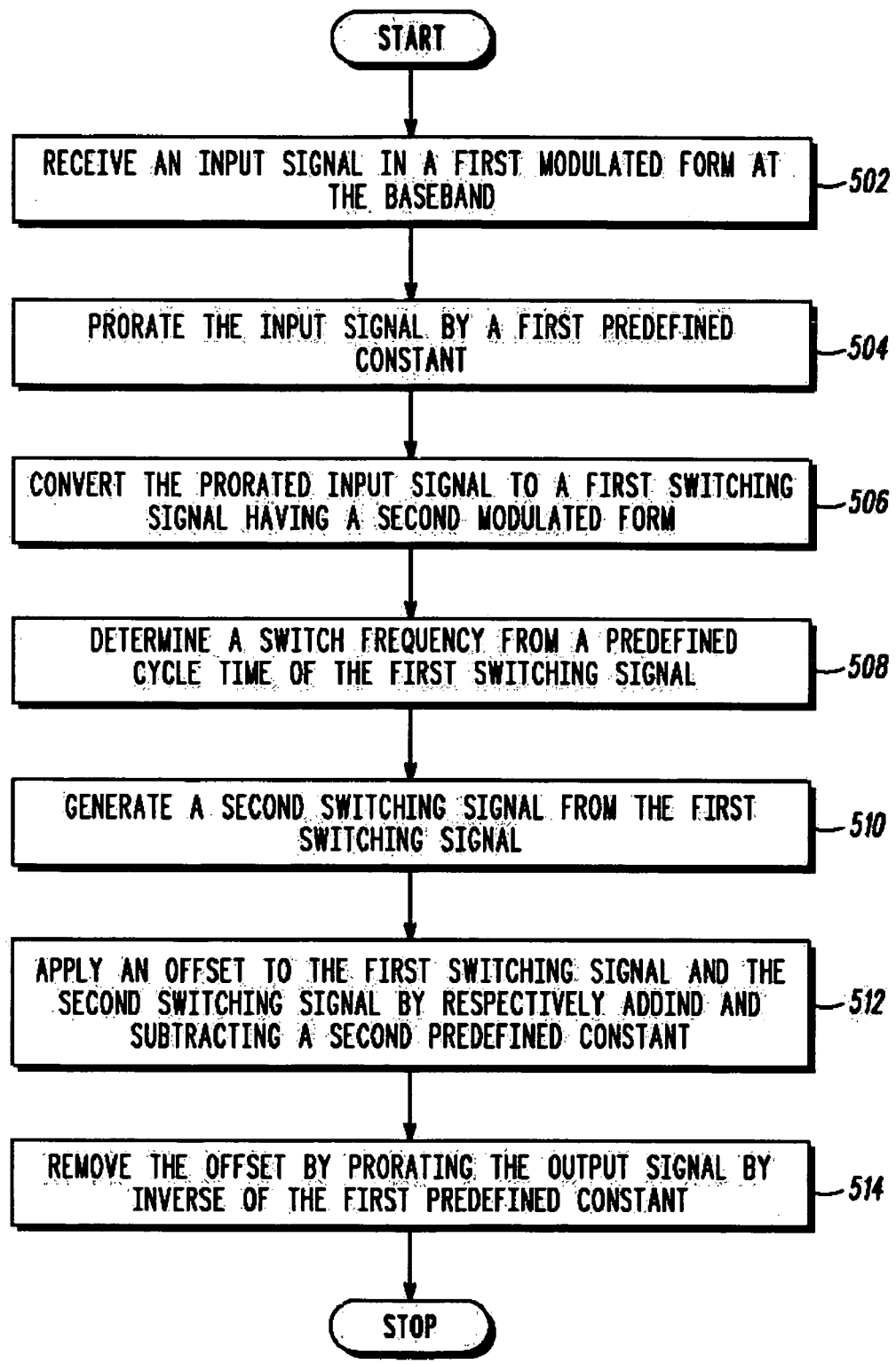
FIG. 5 represents a flowchart depicting a detailed method for creating a spectral null in switching amplifiers in accordance with some embodiments of the present invention.

FIG. 5 represents a flowchart depicting a detailed method for creating a spectral null in switching amplifiers in accordance with some embodiments of the present invention. At step 502, an input signal is received in the first modulated form at the baseband of the amplifier system. In an embodiment of the invention, the input signal is received at PCM SRC block 302. After receiving the input signal in the first modulated form, the input signal is prorated by a first predefined constant, at step 504. In some embodiments of the present invention the first switching signal may be prorated by a first predefined constant using by a prorating circuitry. In an embodiment of the invention, it is possible to define the scaling constant as ½ during the entire time of operation of the input signal. At step 506, the prorated signal is converted from a first modulated form to a second modulated form and is referred to as a first switching signal. Step 506 is performed at the modulation conversion circuitry 110 of the signal processing unit 104. At step 508, a switch frequency of the first switching signal is determined from a predefined cycle time of the first switching signal. After determining the switch frequency of the first switching signal at step 508, a second switching signal is generated from the first switching signal by inverting and delaying the first switching signal by a predefined delay amount, at step 510. The second switching signal is generated from the first switching signal at the duty ratio quantizer 312.

Figure 6:
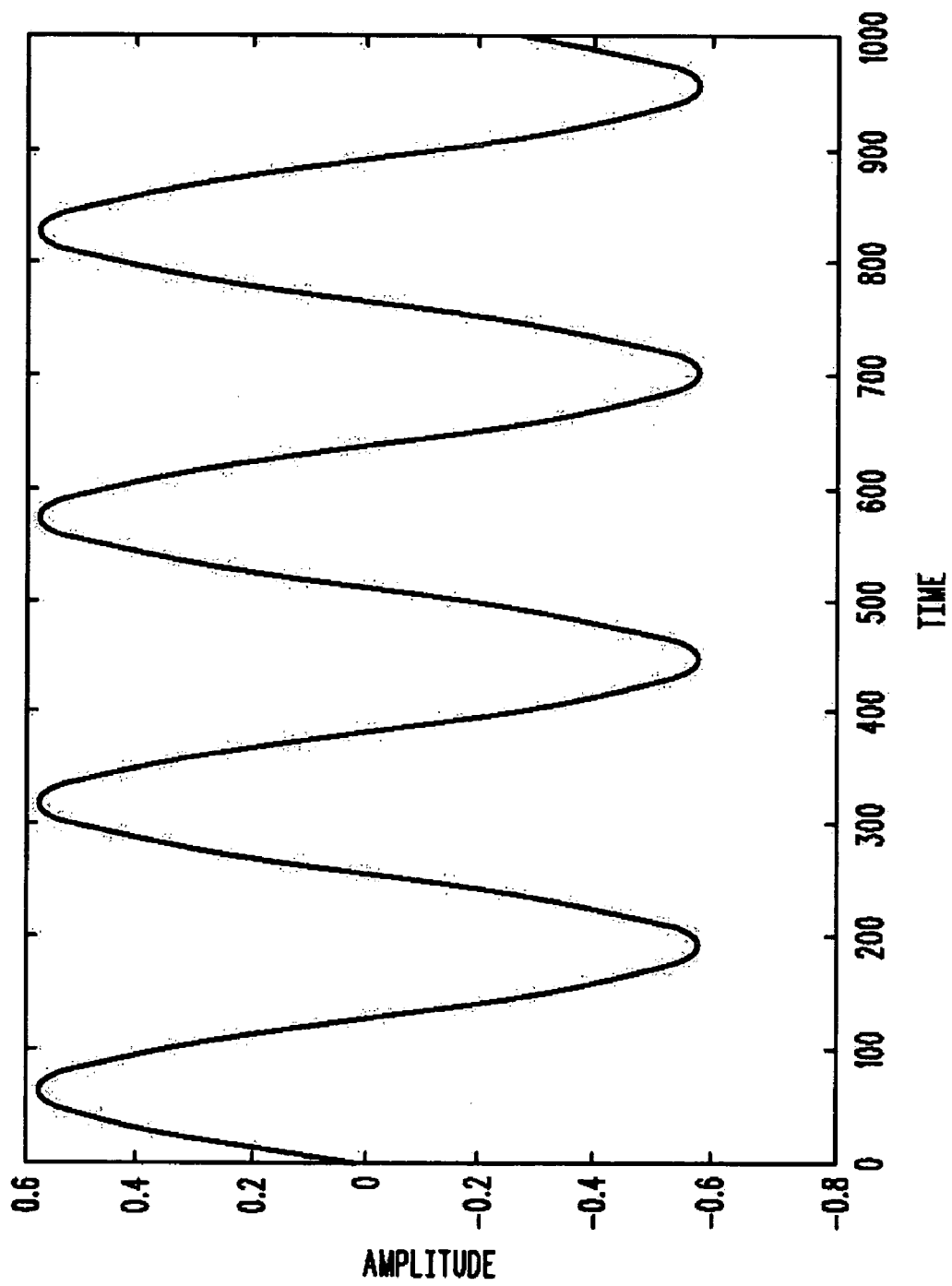
FIG. 6 represents an input to an in-phase channel of a switching amplifier in a first modulated form in accordance with some embodiments of the present invention.

At step 512, the first switching signal and the second switching signal are offset by respectively adding and subtracting a second predefined constant from the first switching signal and the second switching signal. The step 512 is performed at the summation block 320. In an embodiment of the invention, step 512 may exist implicitly after step 510 due to the addition of the constant to the signal in step 504. The output signal at step 512 is a two-state signal that does not have a component at the switch frequency or its odd-harmonics. At step 514, the offset introduced at step 504 is removed by prorating the output signal with a value that is the inverse of the first predefined constant. Prorating of the output signal is performed at the fourth multiplier block 324. The two-state output signal does not have a component at the switch frequency and its odd harmonics since the first switching signal and the second switching signal are of the same frequency but are delayed by a predefined delay amount. The output signal is a two-state signal caused by the non-overlapping spectrum of the first switching signal and the second switching signal FIG. 6 represents the input to the in-phase channel of a switching amplifier in a first modulated form in accordance with some embodiments of the present invention. The input signal is a cyclic PCM signal. In an embodiment of the present invention, the modulation conversion circuitry is not needed if the input signal is a cyclic PWM signal or a cyclic PDM signal. FIG. 6 representatively shows a cyclic sine wave input. In some embodiments of the invention, the input may be a baseband signal or any other signal which might not be cyclic in nature.

FIG. 7 illustratively represents duty cycle representations for a single-stream case for the in phase channel of the modulator in accordance with some embodiments of the present invention. FIG. 7 shows the signal that results after the input signal of FIG. 6 has been processed. The duty cycle representations are for the first switching signal and the second switching signal for single-stream cases. The first switching signal and the second switching signal have non-overlapping waveforms and the same frequency. The non-overlapping spectra and the same frequency of the first switching signal and the second switching signal with the second switching signal being delayed by a predefined delay amount result in the two-state output signal that does not have a component at the switch frequency or its odd harmonics.

Figure 8:
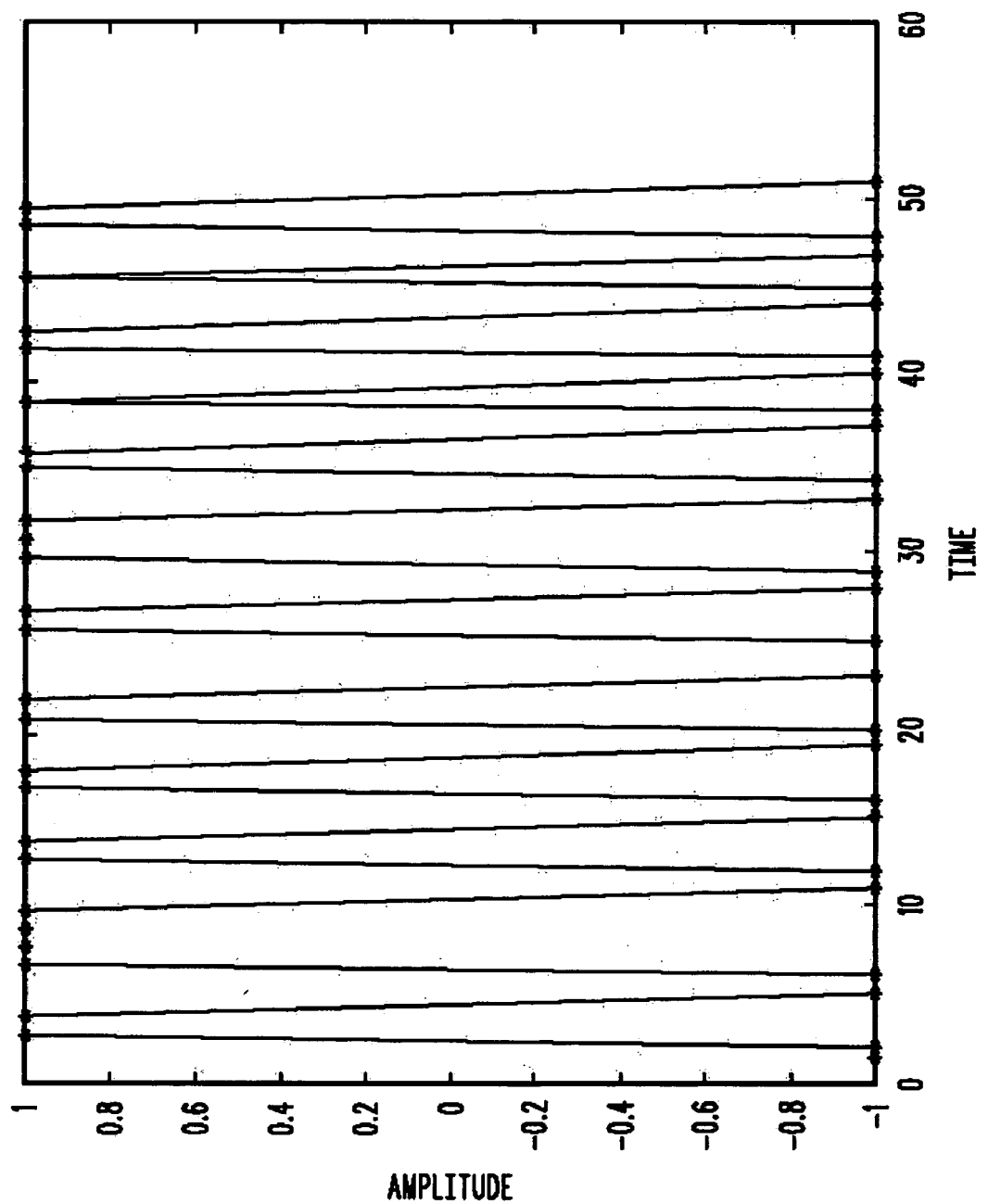
FIG. 8 illustratively represents an output of a quadrature mix after mixing in-phase and the quadrature-phase output signals in a second modulated form in accordance with some embodiments of the present invention.

FIG. 8 illustratively represents the output of a quadrature mix after mixing the in-phase and the quadrature-phase output signals in the second modulated form in accordance with some embodiments of the present invention. FIG. 8 shows the output PWM signal from a quadrature mix circuitry as shown in FIG. 2 after mixing the in-phase and the quadrature-phase output PWM signals. The output PWM signal is free from switching frequency and its odd harmonics components. This results in a signal which could appear to have it's switching frequency doubled. The received input signal is shown in FIG. 6 and the first switching signal and the second switching signal are shown in FIG. 7. The in-phase and the quadrature phase component of the first switching signal and the second switching signal are added. The added signal is shown in FIG. 8.

Figure 9:
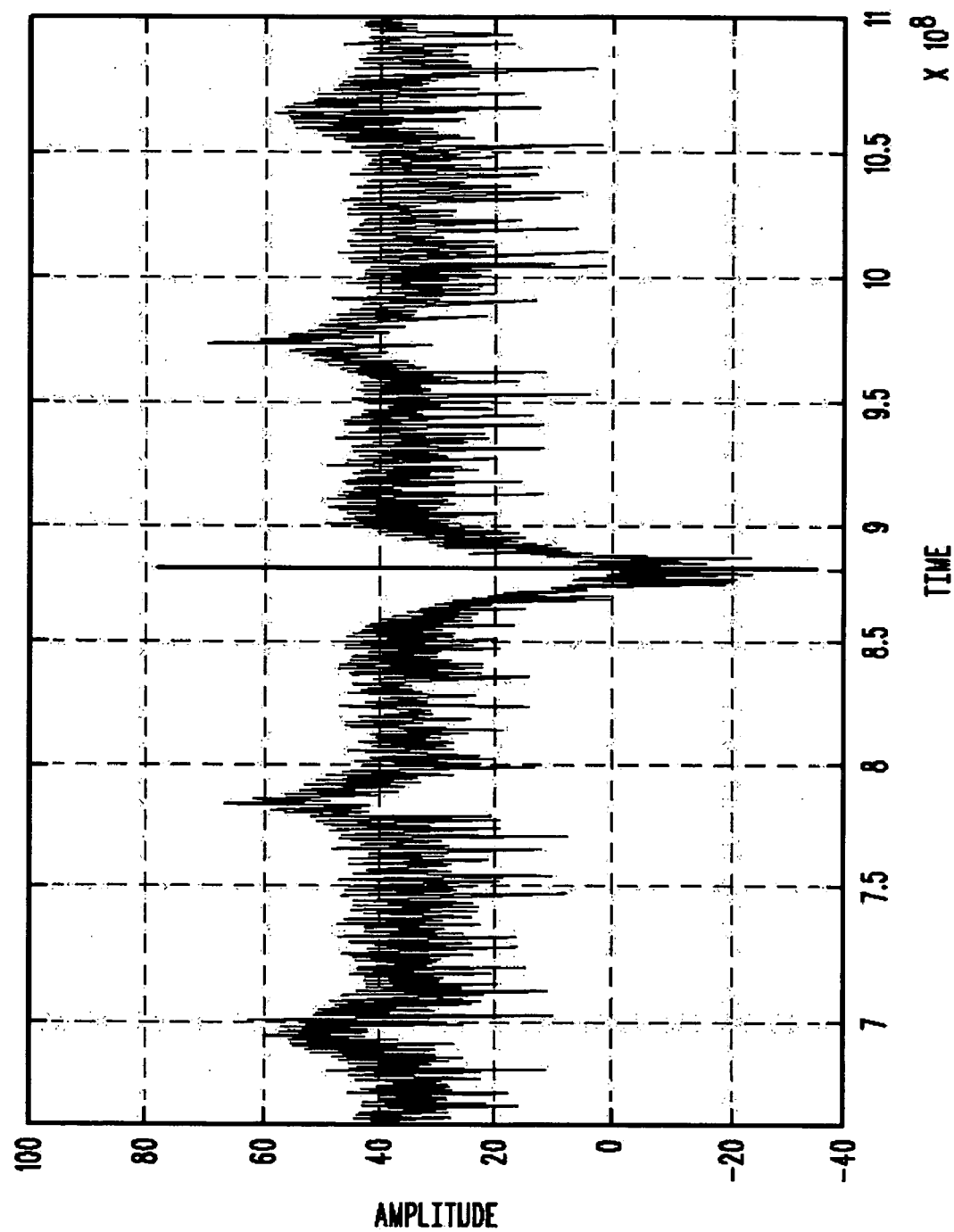
FIG. 9 illustratively shows an output of a switching amplifier system showing a switching frequency and its odd harmonics in accordance with some embodiments of the present invention.

FIG. 9 illustratively shows the output of a switching amplifier system showing the switching frequency and its odd harmonics removed, leaving only spread versions of even harmonics in accordance with some embodiments of the present invention. The noise in the output signal in the passband has been minimized by noise shaping. Although the switching frequency and its odd harmonics are not in the pass band and therefore cannot be heard in the speaker or an antenna or any other load, forgoing elimination would result in increased amplifier design complexity, result in power loss and possible interference with other circuitry (not shown) in an amplifier system.

The various embodiments of the method and system for creating a spectral null in a switching amplifier described herein have innumerous advantages over already existing technologies for creating a spectral null. Various embodiments of the present invention allow the elimination of switching frequency and its odd harmonics from an input signal to the amplifier system. The single-stream variable-frequency suppressed carrier block 300 shown in FIG. 3 eliminates the odd harmonics of the switching frequency and thus causes reduction in noise. The output signal is a two-state PWM signal that does not have any components at the switching frequency and its odd harmonics as is shown in FIG. 8. The method for eliminating the switching frequency and its odd harmonics, in accordance with some embodiments of the present invention reduces the amplifier design complexity, power loss, and possible interference. The system for creating a spectral null in a switching amplifier significantly reduces the complexity of the amplifier system. It will be appreciated the method and system for creating a spectral null in a switching amplifier described herein may comprise one or more conventional processors and unique stored program instructions that control the one or more processors to implement, in conjunction with certain non-processor circuits, some, most, or all of the functions of the method for creating a spectral null in a switching amplifier described herein. The non-processor circuits may include, but are not limited to, a radio receiver, a radio transmitter, signal drivers, clock circuits, power source circuits, and user input devices. As such, these functions may be interpreted as steps of a method for creating a spectral null in a switching amplifier system. Alternatively, some or all functions could be implemented by a state machine that has no stored program instructions, or in one or more application specific integrated circuits ASICs, in which each function or some combinations of certain of the functions are implemented as custom logic. Of course, a combination of the two approaches could be used. Thus, methods and means for these functions have been described herein.

It is expected that one of ordinary skill, notwithstanding possibly significant effort and many design choices motivated by, for example, available time, current technology, and economic considerations, when guided by the concepts and principles disclosed herein will be readily capable of generating such software instructions and programs and ICs with minimal experimentation.

In the foregoing specification, the invention and its benefits and advantages have been described with reference to specific embodiments. However, one of ordinary skill in the art appreciates that various modifications and changes can be made without departing from the scope of the present invention as set forth in the claims below. Accordingly, the specification and figures are to be regarded in an illustrative rather than a restrictive sense, and all such modifications are intended to be included within the scope of present invention. The benefits, advantages, solutions to problems, and any element(s) that may cause any benefit, advantage, or solution to occur or become more pronounced are not to be construed as a critical, required, or essential features or elements of any or all the claims. The invention is defined solely by the appended claims including any amendments made during the pendency of this application and all equivalents of those claims as issued.

I claim:

1. A method for creating at least one spectral null in a switching amplifier system, the method comprising:
    receiving input signal in a first modulated form;
    converting the input signal to a first switching signal, wherein the first switching signal is in a second modulated form;
    determining a switch frequency from a predefined cycle time of the first switching signal;
    generating a second switching signal from the first switching signal, the second switching signal being inverted and delayed by a delay amount as compared to the first switching signal; and
    summing the first switching signal with the second switching signal to provide only a two-state output signal in order to create the at least one spectral null.

2. The method of claim 1 further comprising prorating the input signal by a first predefined constant.

3. The method of claim 1 further comprising applying an offset to the first switching signal and the second switching signal by respectively adding and subtracting a second predefined constant.

4. The method of claim 1 further comprising removing the offset by prorating the output signal by inverse of a first predefined constant.

5. The method of claim 1, wherein pulse width of the second switching signal is the same as that of a corresponding pulse of the first switching signal.

6. The method of claim 1, wherein the second modulated form can be at least one of pulse width modulation (PWM) form and pulse density modulation (PDM) form.

7. The method of claim 6, wherein each of the first switching signal and the second switching signal is of a signal type selected from a group consisting of a PWM signal and a PDM signal.

8. The method of claim 7, wherein each of the first switching signal and the second switching signal is at least one of a single sided and a double sided PWM signal.

9. A circuitry for creating at least one spectral null in a switching amplifier system, the circuitry comprising:
    an input module that receives an input signal in a first modulation form;
    a modulation conversion circuitry coupled to the input for modulating the input signal and generating a first switching signal from the input signal;
    a frequency determining circuitry for determining a switching frequency of the first switching signal;
    an inverting delay circuitry coupled to the modulation conversion circuitry for generating a second switching signal from the first switching signal, the second switching signal being inverted and delayed by a delay amount as compared to the first switching signal; and
    a summing circuitry for summing the first switching signal from the second switching signal to provide only a two-state output signal in order to create the at least one spectral null.

10. The circuitry of claim 9 further comprising a prorating circuitry for prorating the input signal by a first predefined constant.

11. The circuitry of claim 9, wherein the modulation conversion circuitry comprises at least one of pulse width modulation (PWM) and pulse density modulation (PDM) circuitry.

12. The circuitry of claim 11, wherein each of the first switching signal and the second switching signal is of a signal type selected from a group consisting of a PWM signal and a PDM signal.

13. The circuitry of claim 11, wherein each of the first switching signal and the second switching signal is a two sided PWM signal.

14. The circuitry of claim 9, wherein the pulse width of the second switching signal is the same as that of a corresponding pulse of the first switching signal.

* * * * *